(12) United States Patent
Sanders et al.

(10) Patent No.: US 7,460,741 B2
(45) Date of Patent: Dec. 2, 2008

(54) FIBER OPTIC CURRENT SENSOR AND METHOD FOR SENSING CURRENT USING THE SAME

(75) Inventors: Glen A. Sanders, Scottsdale, AZ (US); Steve J. Sanders, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/647,654

(22) Filed: Dec. 29, 2006

(65) Prior Publication Data
US 2008/0159684 A1 Jul. 3, 2008

(51) Int. Cl.
*G02B 6/00* (2006.01)
(52) U.S. Cl. .............................. 385/12; 356/483; 324/96
(58) Field of Classification Search .................. 385/12; 324/96; 356/483
See application file for complete search history.

(56) References Cited
U.S. PATENT DOCUMENTS 5,214,377 A * 5/1993 Maurice et al. ............. 324/204
2006/0126990 A1 * 6/2006 Deng et al. .................. 385/12

OTHER PUBLICATIONS

Kurosawa K. et al., "Flexible Fiber Faraday Effect Current Sensor Using Flint Glass Fiber and Reflection Scheme", Ieice Transactions on Electronics, Electronics Society, Tokyo, JP, vol. E83-C, No. 3, Mar. 3, 2000, pp. 326-329.

* cited by examiner

Primary Examiner—Hemang Sanghavi
Assistant Examiner—Kajli Prince
(74) Attorney, Agent, or Firm—Black Lowe & Graham, PLLC

(57) ABSTRACT

An apparatus for sensing current and a method for sensing current are provided. The apparatus includes an optical fiber having first and second opposing ends and a hollow passageway therethrough, a recirculator configured such that when light propagates from the respective first and second ends of the optical fiber, at least some of the light is reflected by the recirculator into the respective opposing ends of the optical fiber to propagate through the optical fiber and form an optical loop having an opening therethrough, and a Faraday sensitive material positioned in the optical loop such that the light passes therethrough, an index of refraction of the Faraday sensitive material changes when a current flows through the opening of the optical loop.

19 Claims, 7 Drawing Sheets

FIBER OPTIC CURRENT SENSOR AND METHOD FOR SENSING CURRENT USING THE SAME

TECHNICAL FIELD

The present invention generally relates to a method and apparatus for sensing current, and more particularly relates to a fiber optic current sensor and a method for sensing current with an optical fiber.

BACKGROUND

Ring laser gyroscopes (RLGs) and fiber optic gyroscopes (FOGs) have become widely used technologies in many systems, typically to sense the rotation and angular orientation of various objects, such as aerospace vehicles. Both RLGs and FOGs work by directing light in opposite directions around a closed optical path that encloses an area having a normal along an axis of rotation. If the device is rotated about this axis of rotation, the optical path length for the light traveling in one direction is reduced, while the optical path length for the light traveling in the opposite direction is increased. The change in path length causes a phase shift between the two light waves that is proportional to the rate of rotation.

Generally speaking, the signal to noise sensitivity of such gyroscopes increases as the optical path lengths and diameters of the closed optical path are increased. In this sense, both RLGs and FOGs have an advantage in that light is directed around the axis of rotation multiple times. In RLGs, a series of mirrors is used to repeatedly reflect the light around the axis, forming a high finesse resonator. In FOGs, the light travels around the axis through a coil (with numerous turns) of optical fiber, which often has a length of several kilometers.

In recent years, resonator fiber optic gyroscopes (RFOGs) have been developed which combine the above-described path length benefits of RLGs and FOGs into a single device that uses both a recirculating element, such as a mirror or a fiber coupler, and a multi-turn optical fiber coil to form an optical resonator. The combined benefits of RLGs and FOGs allow RFOGs to use shorter optical fiber and to be relatively small. One potential difficulty associated with RFOGs is that phase shifts can occur that are not attributable to rotation, but rather to the fact that monochromatic light is propagating in a glass medium provided by a conventional optical fiber.

Even more recently, Sagnac interferometers, like those used in FOGs, have been used to sense other phenomena, such as electric current. Typically, the implementation of such sensors, as well as RFOGs, is difficult and expensive. One reason for this is because the conductor through which the current is to flow may either be cut or disconnected from its electrical system, or a transformer may be installed in series with the current. The above-noted difficulty associated with RFOGs for rotation measurement applies to current sensing, in that phase shifts often occur that are not attributable to presence of electric current. These errors may be attributed to the propagation of monochromatic light in a glass medium, as provided by a conventional optical fiber.

Accordingly, it is desirable to provide a fiber optic current sensor with improved performance and reduced costs. Furthermore, other desirable features and characteristics of the present invention will become apparent from the subsequent detailed description and the appended claims, taken in conjunction with the accompanying drawings and the foregoing technical field and background.

BRIEF SUMMARY

An apparatus is provided for sensing current. The apparatus includes an optical fiber having first and second opposing ends and a passageway therethrough, a recirculator configured such that when light propagates from the respective first and second ends of the optical fiber, at least some of the light is reflected by the recirculator into the respective opposing ends of the optical fiber to propagate through the optical fiber and form an optical loop having an opening therethrough, and a Faraday sensitive material positioned in the optical loop such that the light passes therethrough, an index of refraction of the Faraday sensitive material changing when a current flows through the opening of the optical loop.

A fiber optic current sensor is provided. The fiber optic current sensor includes a substrate, first and second tunable light sources on the substrate and operable to emit respective first and second beams of light, a recirculator on the substrate and configured such that the first and second beams of light are transmitted therethrough, an optical fiber having first and second opposing ends and a hollow passageway therethrough, at least one end of the optical fiber being connected to the substrate and the optical fiber being arranged such that, after being transmitted by the recirculator, the first beam of light enters the first end of the optical fiber and is emitted from the second end of the optical fiber onto the recirculator and the second beam of light enters the second end of the optical fiber and is emitted from the first end of the optical fiber onto the recirculator, a portion of the first beam being reflected by the recirculator into the first end of the optical fiber and a portion of the second beam being reflected by the recirculator into the second end of the optical fiber such that the optical fiber and the recirculator jointly form a resonant optical loop with an opening therethrough, the first beam propagating around the resonant optical loop in a clockwise direction and the second beam propagating around the resonant optical loop in a counterclockwise direction, and at least some of the first beam and at least some of the second beam being transmitted by the recirculator, a Faraday sensitive material positioned in the hollow passageway, an index of refraction of the Faraday sensitive material changing from a first value to a second value in the clockwise direction of light propagation and from a third value to a fourth value in the counterclockwise direction of light propagation when a current flows through the opening of the optical loop, first and second photo-detectors on the substrate arranged to capture the respective at least some of the first and second beams of light, and a processor on the substrate and in operable communication with the first and second light sources and the first and second photo-detectors. The processor is configured to tune the first and second tunable light sources, calculate a difference between respective first and second resonance frequencies for the clockwise and counterclockwise directions around the optical loop, and determine a current flowing through the opening in the optical loop based on the difference between the first and second resonance frequencies.

A method for sensing current is provided. A recirculator and an optical fiber having first and second opposing ends are arranged such that a first beam of light that is transmitted by the recirculator enters the first end of the optical fiber and is emitted from the second end of the optical fiber onto the recirculator and a second beam of light transmitted by the recirculator enters the second end of the optical fiber and is emitted from the first end of the optical fiber onto the recirculator. A portion of the first beam is reflected by the recirculator into the first end of the optical fiber and a portion of the second beam is reflected by the recirculator into the second end of the optical fiber such that the optical fiber and the recirculator jointly form a resonant optical path loop with an opening therethrough, the first and second beams of light propagating around the resonant optical path loop in respective first and second directions. A Faraday sensitive material, having an index of refraction and a Verdet Constant, is positioned within the optical path loop such that the first and second beams of light pass therethrough. A current is conducted through the opening in the optical path loop, said current conduction causing the index of refraction of the Faraday sensitive material to change from a first value to a second value in the first direction and from the first value to a third value for light propagation in the second direction. First and second resonance frequencies for the respective first and second direction of propagation are determined. The current is calculated based on a difference between the first and second resonance frequencies.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, and brief summary or the following detailed description. It should also be noted that FIGS. 1-7 are merely illustrative and may not be drawn to scale.

FIG. 1 to FIG. 7 illustrate an apparatus and a method for sensing current. The apparatus includes an optical fiber having first and second opposing ends and a passageway therethrough, a recirculator configured such that when light propagates from the respective first and second ends of the optical fiber, at least some of the light is reflected by the recirculator into the respective opposing ends of the optical fiber to propagate through the optical fiber and form an optical loop having an opening therethrough, and a Faraday sensitive material positioned in the optical loop such that the light passes therethrough, an index of refraction of the Faraday sensitive material changing from a first value to a second value for light propagation in a first direction around the optical loop and from a third value (e.g., the first value) to a fourth value in a second direction of light propagation around the optical loop when a current flows through the opening of the optical loop.

In one embodiment, a method and apparatus are provided for sensing a current passing through a ring resonator. The ring resonator may include a substrate with a reflector or reflectors mounted or formed thereon and optically coupled to a fiber optic coil. The reflector(s) and fiber may define a closed light path or loop. The light path is configured to direct each of first and second light beams in a different counter-propagating direction around the closed optical path multiple times. Each of the first and second light beams experience a resonance condition when circulating in the closed optical path. A Faraday sensitive material is positioned along the light path, and a conductor is placed through an opening in the light path. When a current is conducted through the conductor, the first and second light beams propagating in the opposing directions experience changes in the index of refraction of the Faraday sensitive material, which alters the respective resonance frequencies for the opposing directions. The difference in the resonance frequencies is determined and used to calculate the current flowing through the conductor.

Figure 1:
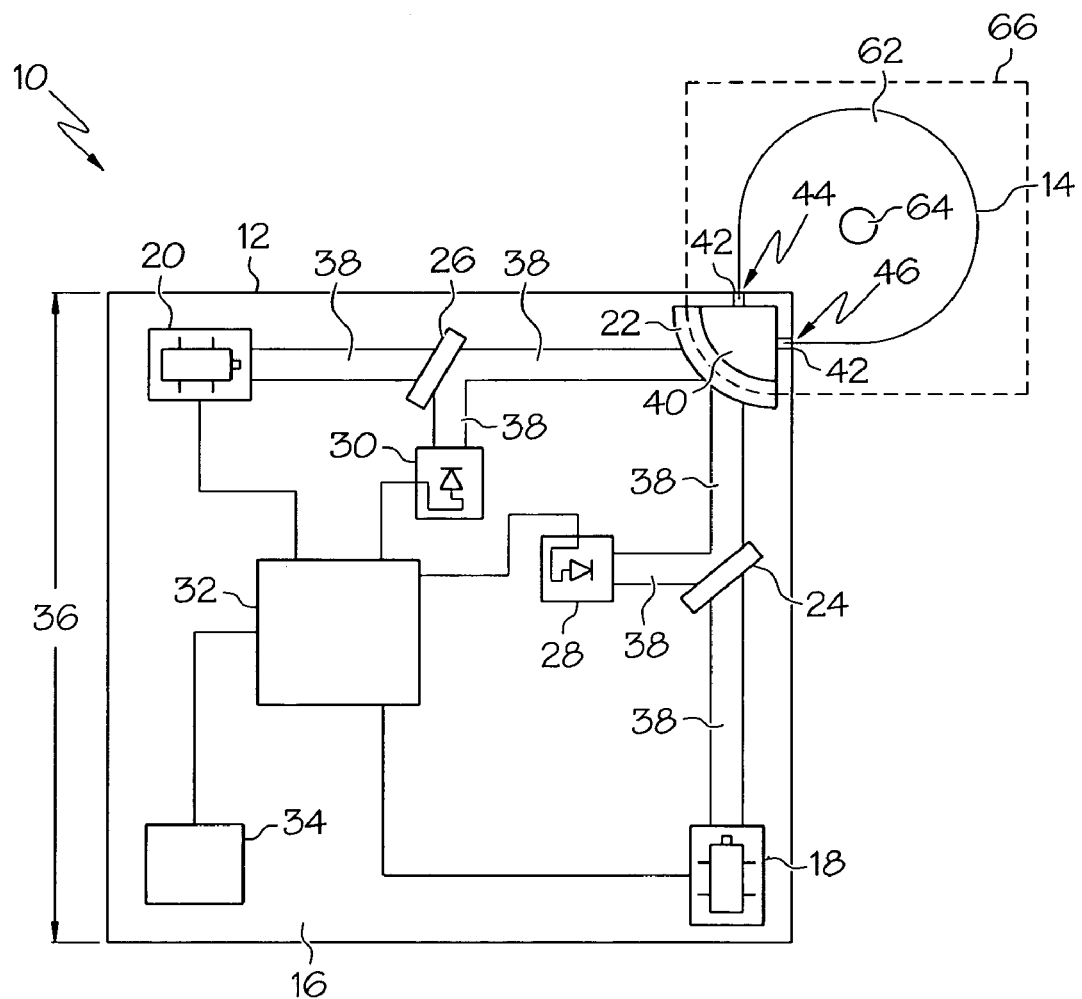
FIG. 1 is a top plan schematic view of a current sensor system, according to one embodiment of the present invention, including a substrate and an optical fiber.

FIG. 1 illustrates a fiber optic current sensor (or current sensor system) 10 according to one embodiment of the present invention. The fiber optic current sensor (or current sensor) 10 includes an integrated optical chip (IOC) 12 and an optical fiber (or fiber optic cable) 14. In the embodiment shown in FIG. 1, the IOC 12 includes a substrate 16 having first and second light sources 18 and 20, a recirculator 22, first and second beam splitters 24 and 26, first and second photodetectors 28 and 30, a controller 32, and a transmitter 34 formed (or positioned) thereon. As will be described in greater detail below, the current sensor 10 may be understood to be implemented similarly to a gyroscope, in particular, a resonator fiber optic gyro (RFOG), as will be appreciated by one skilled in the art.

Still referring to FIG. 1, the substrate 16 is substantially rectangular (e.g., square) with a side length 36 of, for example, less than 3 centimeters (cm), such as between 5 millimeters (mm) and 1.5 cm, and a thickness of, for example, between approximately 600 and 100 micrometers (μm). In one embodiment, the substrate 16 is made of silicon. It will be appreciated that these dimensions, shape, and materials are merely exemplary, and that the substrate 16 could be implemented according to any one of numerous dimensions, shapes, and materials.

The first and second light sources 18 and 20, at least in the depicted embodiment, are positioned near opposing corners of the substrate 16 and oriented, or "aimed," at a third corner of the substrate 16 and/or the recirculator 22. In one embodiment, the first and second light sources 18 are 20 are laser diodes formed or mounted onto the substrate 16. As will be appreciated by one skilled in the art, the laser diodes may be formed by doping a very thin layer on the surface of a doped crystal wafer to form a p-n junction, or diode, having an "n-type" region and a "p-type region." Although not specifically illustrated, the first and second light sources 18 and 20 may be external cavity laser diodes and each also may include a cavity-length modulation mechanism to tune and/or adjust the frequencies of the laser light emitted therefrom, as is commonly understood.

In the embodiment shown in FIG. 1, the recirculator 22 is positioned near the corner of the substrate 16 at which the light sources 18 and 20 are aimed. In one embodiment, the recirculator 22 is a concave mirror with a very high reflectivity (e.g., above 95%) and a non-zero transmittance. As is commonly understood, the recirculator 22 may have a reflectivity for a desired state of polarization of light that is significantly higher than the reflectivity for the state of polarization of light that is orthogonal to the desired state of polarization of light. As will be described in greater detail below, the recirculator 22 is shaped to focus light propagating from the light sources 18 and 20 to the optical fiber 14 and to reflect and focus light propagating from each end of the optical fiber coil towards and into the opposite end of the optical fiber coil. The partial transmittance of the recirculator 22 allows a portion of the light from each of the light sources 18 and 20 into the optical fiber 14 and a portion of the light circulating in the optical fiber 14 to be transmitted to the beam splitters 24 and 26.

Still referring to FIG. 1, the first beam splitter 24 is positioned between the first light source 18 and the recirculator 22, and the second beam splitter 26 is positioned between the second light source 20 and the recirculator 22. Although not illustrated in detail, the first and second beam splitters 24 and 26 are preferably oriented at an angle (e.g., 45 degrees) relative to a line interconnecting the respective first and second light sources 18 and 20 and the recirculator 22.

The first and second photo-detectors 28 and 30 are positioned on the substrate 16 on sides of the first and second beam splitters 24 and 26, respectively, near a central portion of the substrate 16. Additionally, although not specifically illustrated, the first and second photo-detectors 28 and 30 are directed at central portions of the first and second beam splitters 24 and 26, respectively. In a preferred embodiment, the first and second photo-detectors 28 and 30 each include a photodiode having a germanium-doped region formed on the substrate 16. In another embodiment, the photo-detectors 28 and 30 include discrete photo-detector chips made of, for example, germanium or indium gallium arsenide phosphide (InGaAsP).

The controller 32 (or processing subsystem), in one embodiment, is formed on or within the substrate 16, and as will be appreciated by one skilled in the art, may include electronic components, including various circuitry and/or integrated circuits (e.g., a microprocessor and a power supply), such as an Application Specific Integrated Circuit (ASIC) and/or instructions stored on a computer readable medium to be carried out by the microprocessor to perform the methods and processes described below. As shown, the controller 32 is in operable communication with and/or electrically connected to the first and second light sources 18 and 20, the first and second photo-detectors 28 and 30, and the transmitter. The transmitter 34 is formed on the substrate 16 and includes, for example, a radio frequency (RF) transmitter, as is commonly understood.

Still referring to FIG. 1, the IOC 12 and/or the substrate 16, in one embodiment, is a "silicon optical bench," as is commonly understood, and includes a series of trenches (or waveguides) 38 formed within the substrate 16. The trenches 38 interconnect the first and second light sources 18 and 20, the first and second beam splitters 24 and 26, the first and second photo-detectors 28 and 30, and the recirculator 22. In the depicted embodiment, the substrate 16 also includes a recirculator cavity 40 formed adjacent to the concave (i.e., outer) side of the recirculator 22 and two v-grooves 42 formed in an outer wall of the recirculator cavity 40 near the respective corner of the substrate 16.

The optical fiber 14 has a first end 44, a second end 46, and in one embodiment, is would in a coil of a diameter of, for example, between 15 and 125 mm. The optical fiber 14 is, in a preferred embodiment, a glass-based, hollow core, bandgap, optical fiber with an extremely low bend loss. As shown, the first end 44 of the optical fiber 14 is inserted into the v-groove 42 opposite the first light source 18, and the second end 46 of the optical fiber is inserted into the v-groove 42 opposite the second light source 20. A central portion of the optical fiber 14 may bend around the respective corner of the substrate 16 in a substantially circular manner.

Figure 2:
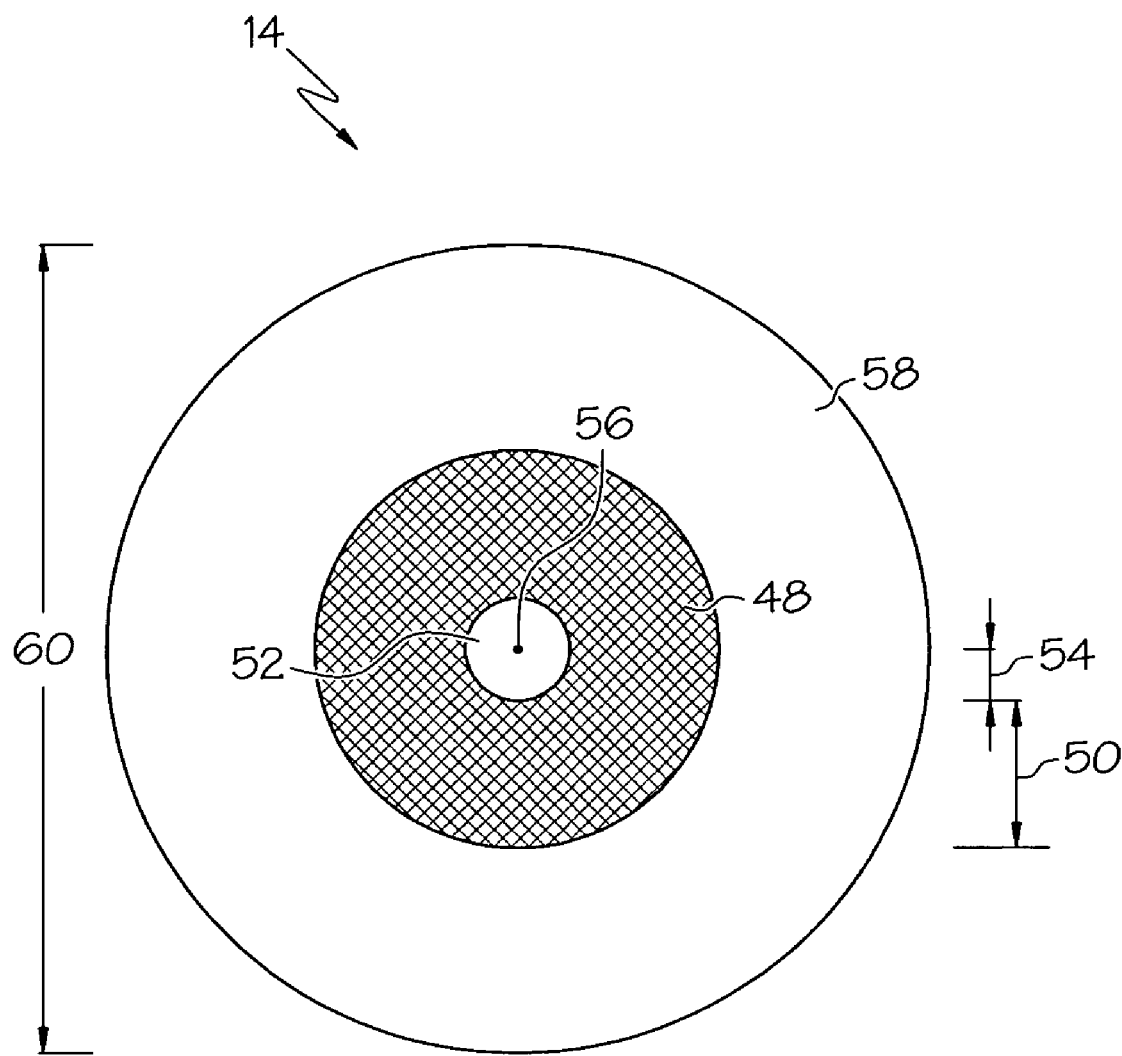
FIG. 2 is a cross-sectional view of the optical fiber of FIG. 1.

Referring now to FIG. 2, the optical fiber 14 includes a region 48 of periodic photonic crystal cells, having a thickness 50 of, for example, between 30 and 40 microns, around a central passageway 52 (i.e., hollow core). The central passageway 52 has a radius 54 of, for example, between 2.5 and 10 microns and extends in a direction parallel to, and is symmetric about, a central axis 56 of the optical fiber 14. The optical fiber 14 also has an outer glass layer 58 which forms an outer surface of the optical fiber 14. The glass portion of optical fiber 14, in one embodiment, has an overall diameter 60 of between 100 and 125 microns. Although not shown in FIG. 2, the optical fiber 14 may also include a protective plastic jacket around the outer glass layer 58. If should be understood that the hollow core fiber may be distinguished from conventional or solid core fiber in that the core (i.e., the central passageway 52) is not a solid material, such as glass. As is described in greater detail below, this allows the hollow core to be filled with a gaseous material or a liquid material that is sensitive to the magneto-optic Faraday effect.

As is discussed in greater detail below, the recirculator 22 is shaped and the first and second ends 44 and 46 of the optical fiber 14 are positioned such that the recirculator 22 receives, and reflects, a large majority of the light from second end 46 into the first end 44, thus forming a resonant cavity for light traveling in a first (i.e., clockwise (CW)) direction. Likewise, the recirculator 22 is positioned to reflect a large majority of the light exiting the first end 44 into the second end 46 of the optical fiber 14, thus forming a resonant cavity in a second (i.e., counterclockwise (CCW)) direction. The concave shape of the recirculator 22 allows the recirculator 22 to focus, or spatially condition, the light to minimize fiber-end to fiber-end optical losses. As such, as will be appreciated by one skilled in the art, and described in greater detail below, the optical fiber 14 and the recirculator 22 may jointly form an optical ring resonator, or a resonant optical path loop, with an opening 62 therethrough, that has resonant frequencies in the CW and CCW directions determined by the roundtrip optical path length inside the resonator path (i.e., optical path loop) in each direction, respectively. It should also be noted that, in one embodiment, because of the recirculator cavity 40 and the hollow core 52 of the optical fiber 14, the resonator path travels substantially only in free space (i.e., the light does not travel through glass for any appreciable distance).

Figure 3:
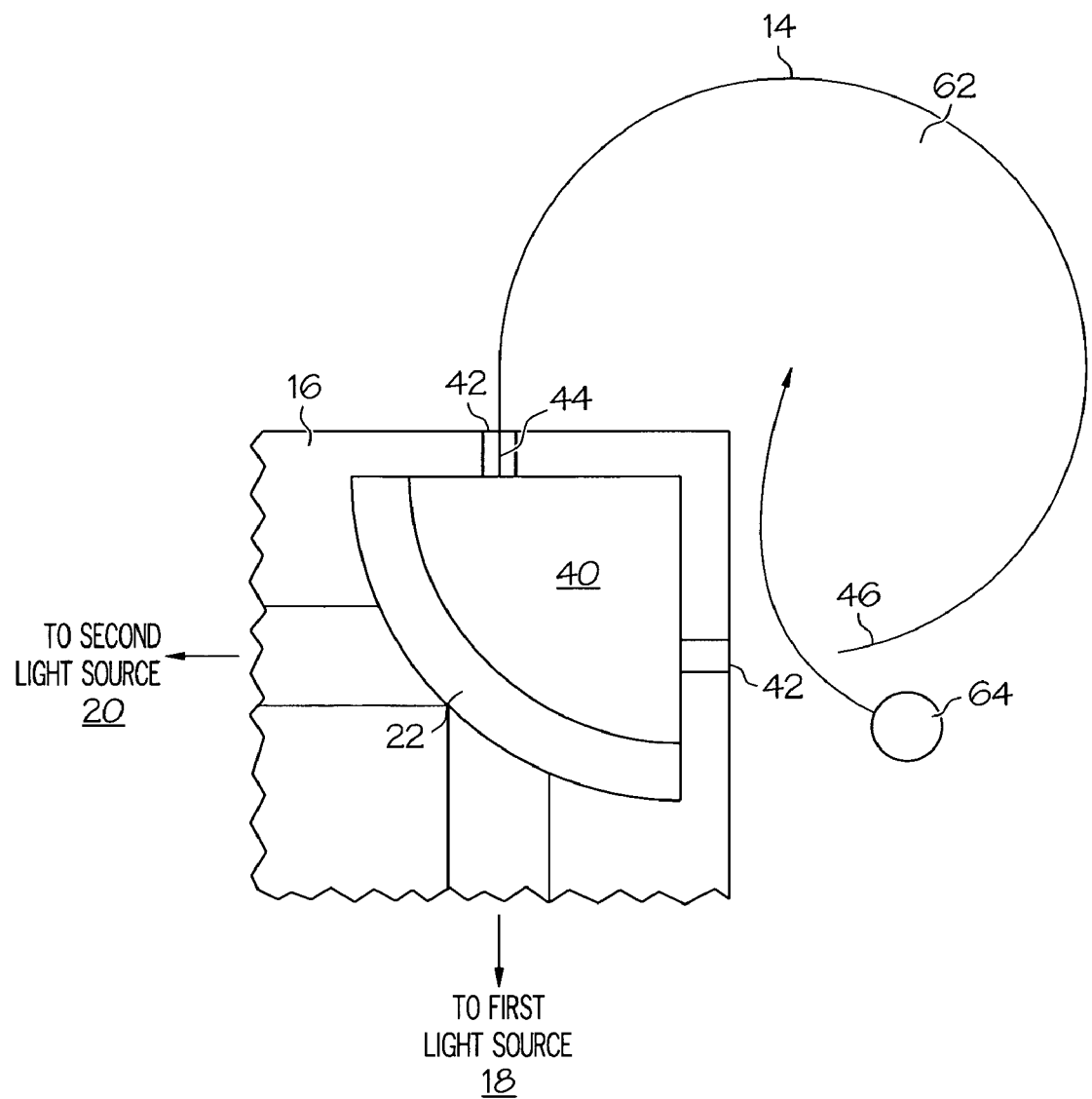
FIG. 3 is a top plan view of a portion of the current sensor system of FIG. 1 illustrating the installation of a conductor.

Referring again to FIG. 1, an electrical conductor (e.g., a wire) 64 passes through a central portion of the opening 62 of the resonator. FIG. 3 illustrates a method for positioning, or passing, the conductor 64 through the opening 62 without having to disconnect, or cut, the conductor 64. As shown in FIG. 3, the second end 46 of the optical fiber 14 may be removed from the v-groove opposite the second light source 20 to "open" the optical path loop. The conductor 64 may then be inserted into the opening 62 through the gap formed between the second end 46 of the optical fiber 14 and the substrate 16. After the conductor 64 is positioned, the second end 46 of the optical fiber 14 may be inserted into the v-groove 42 to "close" the optical path loop. Although not shown, the conductor 64 may be a component of a larger electrical system, such as an electrical system within an aerospace vehicle or an electric power utility for, for example, a fuel cell in an automobile, a generator or motor, or a welding system Referring again to FIG. 1, the fiber optic current sensor 10 also includes a Faraday medium chamber 66 enclosing the optical fiber 14 and the recirculator cavity 40. In one embodiment, the Faraday medium chamber 66 is hermetically sealed and includes a Faraday sensitive medium, as will be described in greater detail below, such as a Faraday sensitive fluid (i.e., gas and/or liquid). The medium chamber 66 may, in another embodiment, encompass the entire sensor 10, with a hermetic connector allowing passage of electric power or electrical signals in and out of the sensor 10. The Faraday sensitive material may fill the entire Faraday medium chamber 66, including the hollow passageway 52 within the optical fiber 14 and the recirculator cavity 40.

In one embodiment, a Faraday sensitive gas is injected into the Faraday medium chamber 66. As will be appreciated by one skilled in the art, many substances experience a change of index of refraction for circular polarization states based due to exposure to magnetic fields. The magnitude of this sensitivity may be characterized by the Verdet constant and varies from one medium to another. For gases, the preferred medium may be based on the Verdet constant in order to improve the signal to noise ratio of the sensor, as well as the reactive characteristics of the gas. As such, inert gases are attractive because they are least chemically reactive with the other materials in the sensor 10, thus improving the reliability. Amongst the inert gases, the sensitivity increases as the atomic number of the gas increases. For example, xenon is preferable over helium, as the Verdet constant of xenon is approximately eighty times greater than that of helium. Additionally, the Verdet constant of a chosen gas may be increased by increasing pressure. In one embodiment, the Faraday sensitive material used is xenon maintained at a pressure of approximately 10 atmospheres (atm), which has a Verdet constant approximately ten times greater than xenon at 1 atm.

It should also be understood that the Verdet constant may also change as a function of the wavelength of the particular light being used. In many gases, the Verdet constant is inversely proportional to the square of the wavelength of the light. Thus, the sensitivity of the sensor 10 may also be increase by using light sources 18 and 20 that emit light with shorter wavelengths (e.g., 1330 or 830 nanometers (nm) rather than 1550 nm).

During operation, referring to FIG. 1, the controller 32 activates the first and second light sources 18 and 20 such that the first and second light sources 18 and 20 emit light, such as laser light (e.g., with a wavelength of approximately 830, 1330, and/or 1550 nm), towards the respective first and second beam splitters 24 and 26. More specifically, the first light source 18 emits a first beam, or portion, (68 in FIG. 4) of laser light towards the first beam splitter 24, and the second light source 20 emits a second beam, or portion, (70 in FIG. 4) of laser light towards the second beam splitter 26. The beam splitters 24 and 26 are arranged such that a significant fraction of the light from the light sources 18 and 20 passes therethrough. Still referring to FIG. 1, the first and second beams of light propagate through the free space inside the trenches 38 towards the recirculator 22. Although not specifically illustrated, the sensor 10 may also include one or more waveplates through which the light passes before reaching the recirculator 22 to ensure that the laser light is circularly polarized, as will be understood by one skilled in the art.

Figure 4:
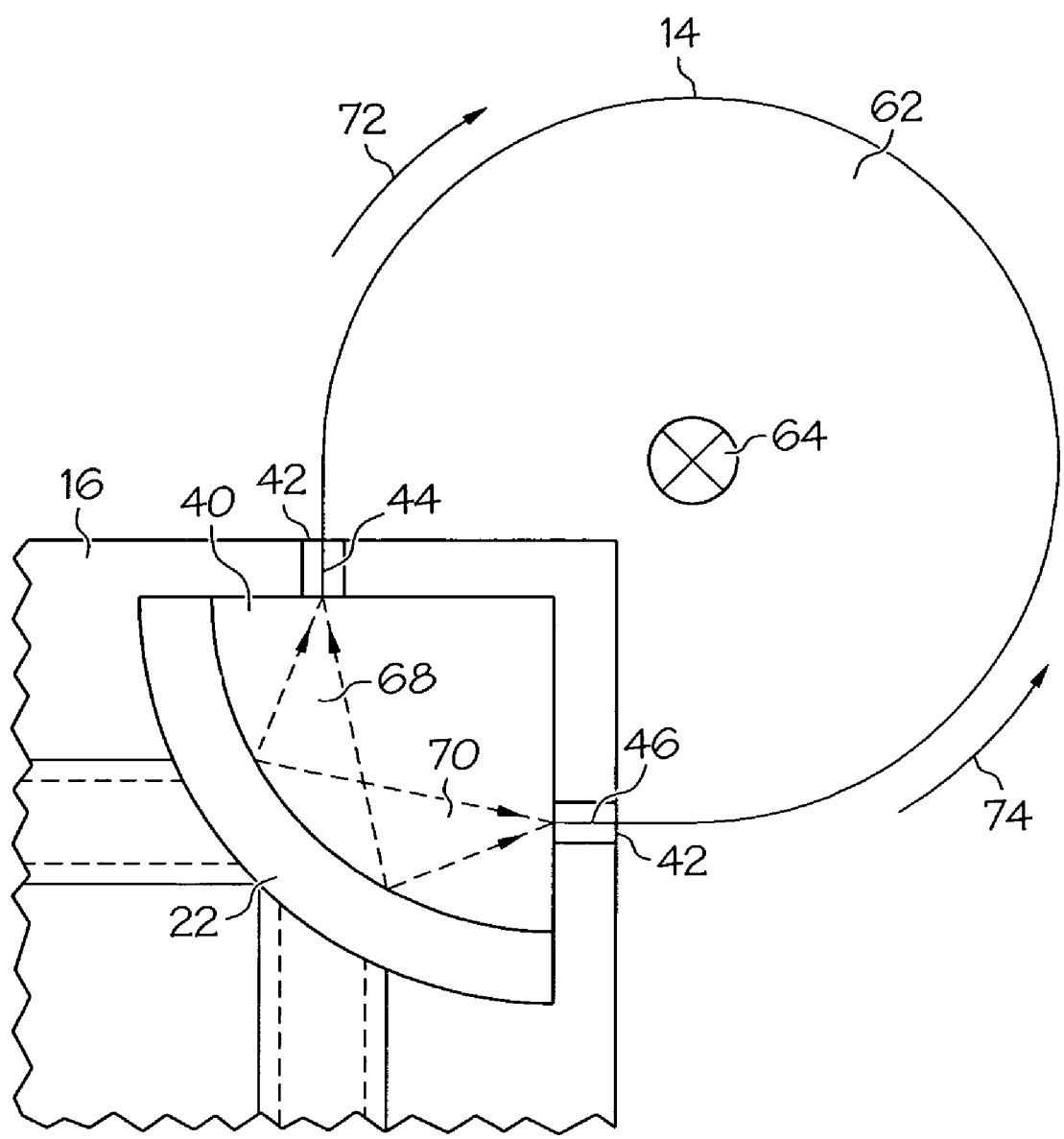
FIG. 4 is a top plan view of the portion of the current sensor system of FIG. 3 illustrating the propagation of light into the optical fiber.

Referring now to FIG. 4, assuming that the resonator is at or near resonance, at least a portion of the first beam 68 passes through, or is transmitted by, the recirculator 22 and continues towards the first end 44 of the optical fiber 14. Likewise, at least a portion of the second beam 70 passes through the recirculator 22 and continues towards the second end of the optical fiber 14. As mentioned above, due to the shape of the recirculator 22, the first and second beams 68 and 70 are focused by the recirculator 22 and enter the respective first and second ends 44 and 46 of the optical fiber 14. As shown in FIG. 4, and mentioned above, the first beam 68 thus propagates through the optical fiber 14, or around the resonator, in a first, or clockwise, direction 72, while the second beam 70 propagates around the resonator in a second, or counterclockwise, direction 74.

Figure 5:
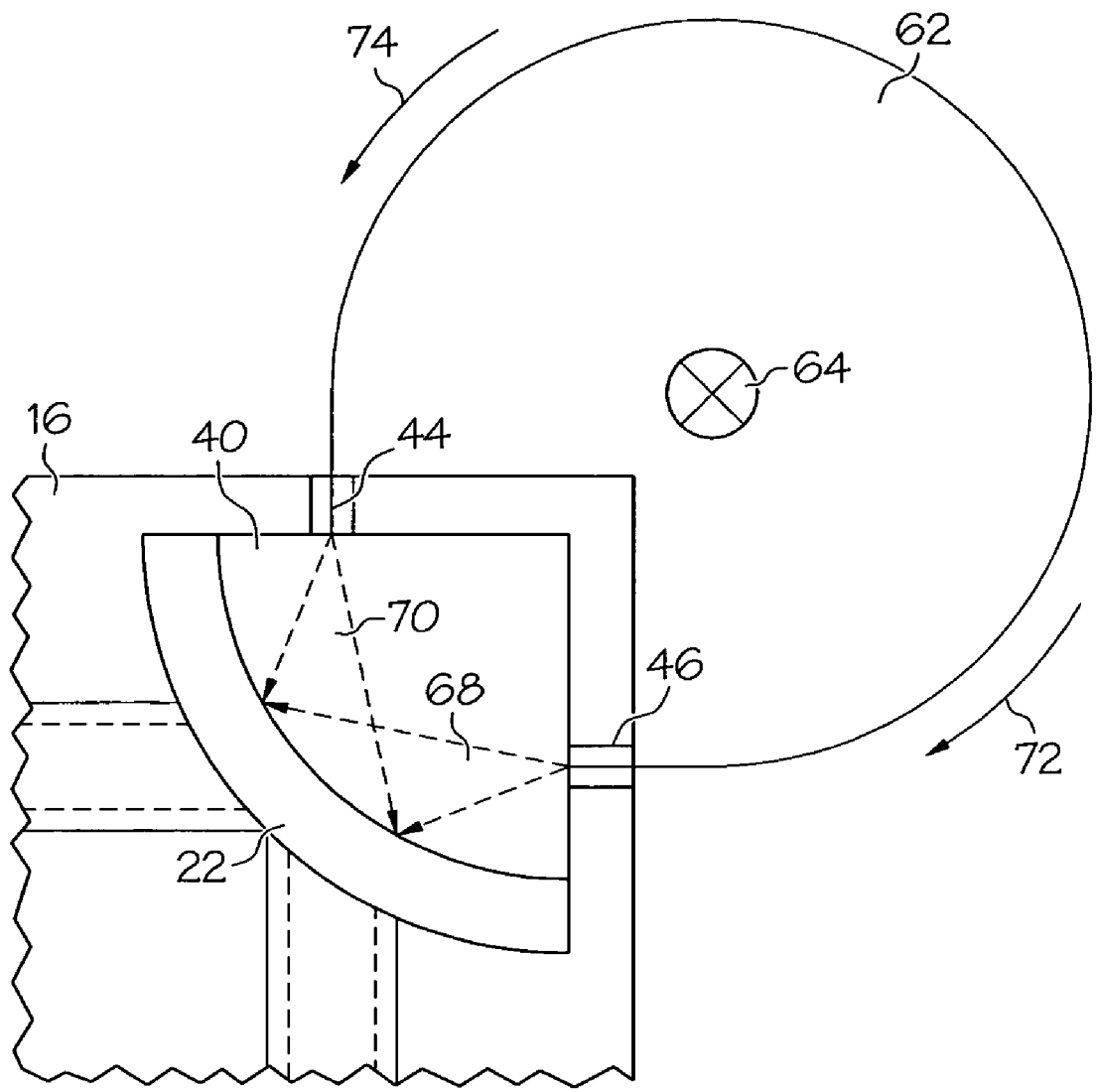
FIG. 5 is a top plan view of the portion of the current sensor system of FIG. 4 illustrating the propagation of light from the optical fiber

As shown in FIG. 5, assuming the resonator is at or near resonance, the first and second beams 68 and 70 continue through the optical fiber 14 in their respective opposing directions. The first beam 68 then propagates from the second end 46 of the optical fiber 14, and the second beam 70 propagates from the first end 44 of the optical fiber. As the first beam 68 exits the second end 46 of the optical fiber 14, the light wave spatially diverges, and thus "fans out," as shown. However, as the light strikes the recirculator 22, because of the concave shape and the high reflectivity of the recirculator 22, a majority of the first beam 68 is reflected and focused towards the first end 44 of the optical fiber 14. Likewise, the second beam 70 exits the first end 44 of the optical fiber 14 and a majority thereof is reflected and focused by the recirculator 22 towards the second end 46 of the optical fiber 14. This process is continually repeated as the light circulating through the optical fiber 14 resonates within the resonator path (i.e., the optical path inside the optical fiber 14 and the optical path from first end 44 of the optical fiber to the recirculator 22 to the second end 46 of the optical fiber 14.

Still referring to FIGS. 4 and 5, as previously suggested, not all of the first and second beams 68 and 70 are reflected by the recirculator 22, as a relatively small portion of each passes through (i.e., is transmitted) the recirculator 22 when the resonator is at or near resonance. More specifically, at least some of the first beam 68 is transmitted by the recirculator 22 and propagates towards the second beam splitter 26, and at least some of the second beam 70 is transmitted by the recirculator 22 and propagates towards the first beam splitter 24. Although not specifically shown, the second beam splitter 26 reflects the portion of the first beam 68 onto the second photo-detector 30, and the first beam splitter 24 reflects the portion of the second beam 70 on the first photo-detector 28. As will be appreciated by one skilled in the art, the photo-detectors 28 and 30 are capable of detecting any relative light levels so that a resonance lineshape center frequency indicative of phase shifts, or resonance frequency differences in the two directions (i.e., CW and CCW), as caused by any changes in the effective optical path experienced by the first and second beams 68 and 70 while propagating around the resonator.

Referring to FIGS. 1, 3, and 4, as will be appreciated by one skilled in the art, when current is conducted, or flows, through the conductor 64, a magnetic field is generated within the opening 62 of the resonator. The generated magnetic field generated causes a change in the index of refraction for circularly polarized light passing through the Faraday sensitive material. More particularly, the current, and the resulting magnetic field, effectively increase the index of refraction of the Faraday sensitive material for the beam of light (68 or 70) propagating around the resonator in one direction (CW or CCW), while effectively decreasing the index of refraction of the Faraday sensitive material for the beam of light propagating in the opposing direction. Thus, the current conducted through the opening 62 causes the index of refraction for the light propagating in, for example, the CW direction to change from a first value to a second value, while the index of refraction for the light propagating in the CCW direction changes from a third value to a fourth value. By design of a reciprocal device, namely light traveling along a common path in opposite directions except for the effect of the Faraday Effect, the first and third values may be substantially equal. The change in the index of refraction alters the effective optical path lengths for the first and second beams 68 and 70, and thus shifts the resonance frequencies thereof in the resonator.

The photo-detectors 28 and 30 are used to detect an intensity of the light beams 68 and 70 search for the resonance frequencies. As such, the first and second photo-detectors 28 and 30 send electrical signals to the controller 32 which represent the absence or presence of constructive interference (within the resonator) of the individual light waves within the first beam 68 at the second photo-detector 30 and the second beam 70 at the first photo-detector 30. Such interference appears as a resonance dip at each photo-detector 28 and 30, as is commonly understood. The controller 32 utilizes the information provided by the photo-detectors 28 and 30 to tune the first and second light sources 18 and 20 to the respective frequencies at which resonance occurs for the amount of current that is being flown through the conductor 64. The controller 32 then calculates a difference between the resonance frequencies for the first and second beams 68 and 70, and determines the amount of current flowing through the conductor 64 based on the difference in the resonance frequencies. As will be understood by one skilled in the art, the determination of the amount of current may be based on the known properties of the Faraday sensitive material and the particular dimensions of the components of the current sensor 10.

One advantage of the current sensor described above is that because the resonator path is entirely within free space, non-linear effects often associated with the use of silica and glass optical fibers are minimized. Another advantage is that because the ends of the optical fiber may be temporarily removed from the substrate, the conductor may be positioned within the opening of the resonator without cutting the conductor or disconnecting the conductor from its electrical system. As a result, the difficulty and costs of installing the current sensor are minimized.

Figure 6:
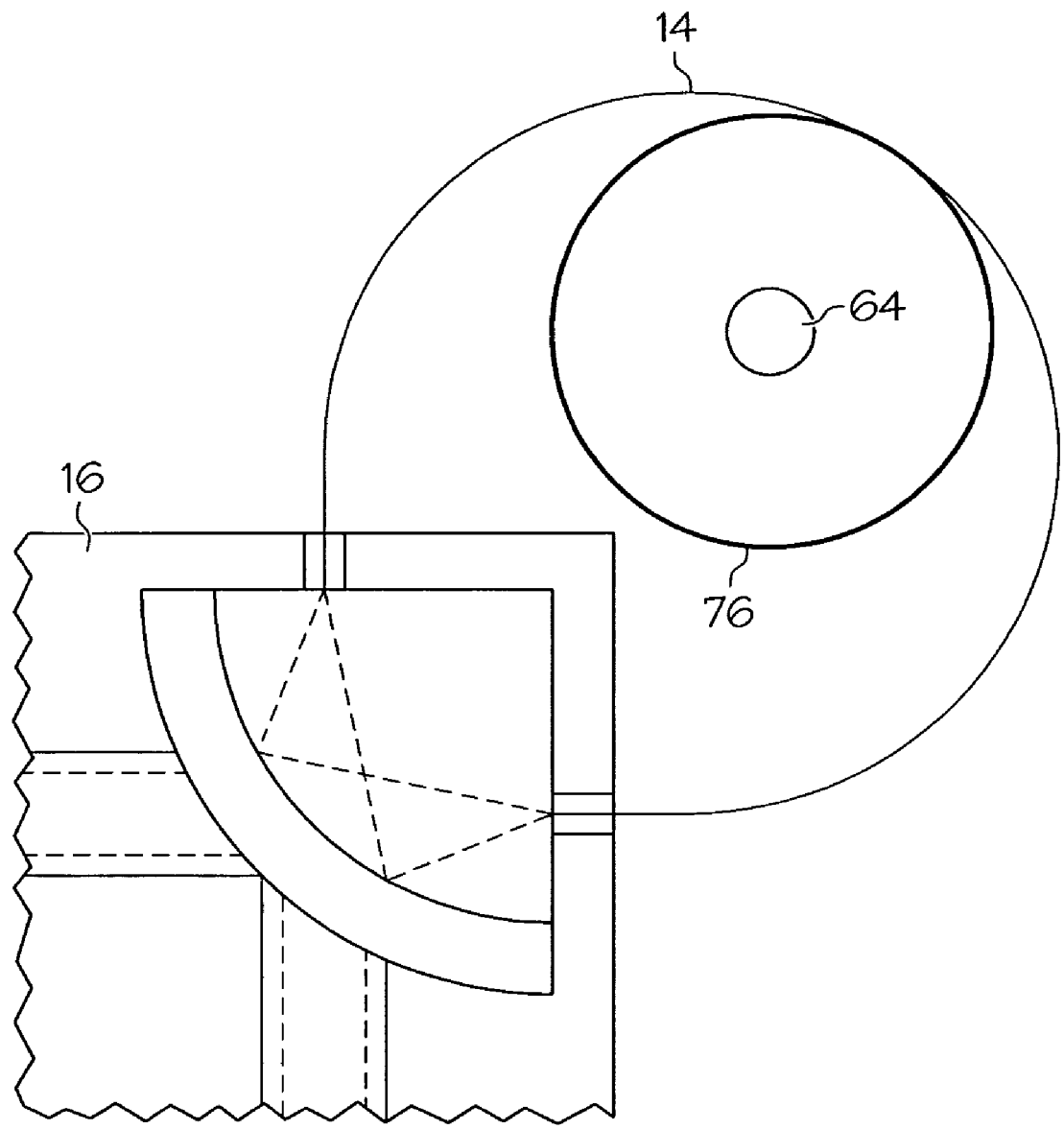
FIG. 6 is a top plan view of a portion of a current sensor system, according to another embodiment of the present invention.

FIG. 6 illustrates a portion of current sensor according to another embodiment of the present invention. In the example shown in FIG. 6, the optical fiber 14 includes, or is wound into, a multi-turn coil 76. As shown, the conductor 64 is positioned within the coil 76. Although not illustrated, in order to form the arrangement shown in FIG. 6, the optical fiber 14, along with the coil 76, may be spread apart into a helical structure (i.e., a "slinky"). After the fiber is temporarily disconnected from the substrate and the chamber 66 is temporarily opened (or a permanent free-space path is provided between the fiber and the substrate, but the chamber 66 is temporarily opened), the conductor 64 may be woven therethrough to be positioned within the opening in the coil 76 as shown. An additional advantage of the embodiment shown in FIG. 6 is that the because of the additional turns around the conductor, the sensitivity and accuracy of the sensor are improved.

Figure 7:
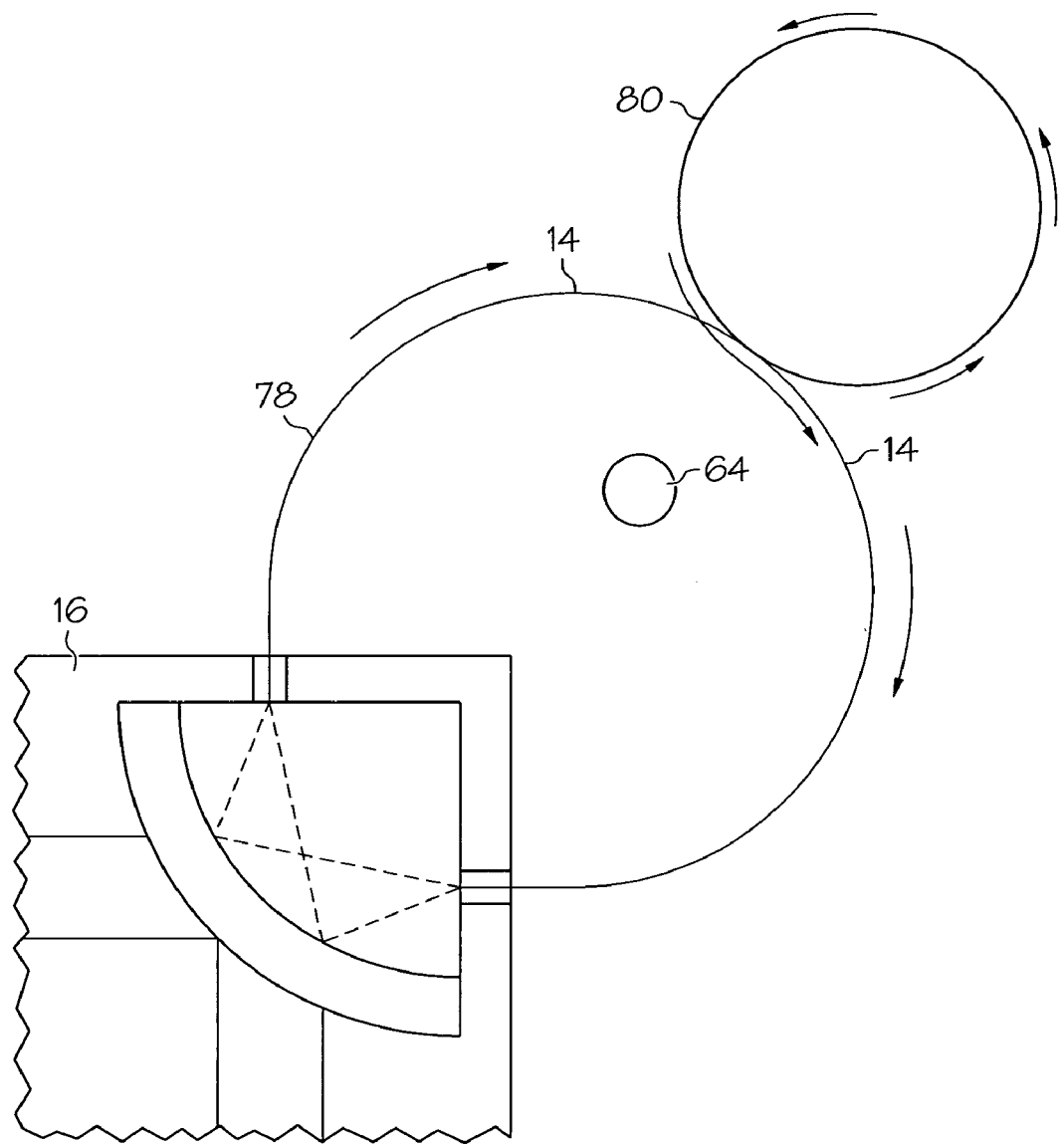
FIG. 7 is a top plan view of a portion of a current sensor system, according to a further embodiment of the present invention.

FIG. 7 illustrates a portion of current sensor according to a further embodiment of the present invention. In the example shown in FIG. 7, the optical fiber 14 includes, or is wound into, first and second coils 78 and 80. As shown, the conductor 64 is positioned within the first coil 78. The first and second coils 78 and 80 are arranged such that the first beam of light propagates around the first coil 78 in one direction (e.g., CW) and propagates around the second coil 80 in the opposite direction (e.g., CCW). Thus, the second beam of light propagates around the first coil 78 in the second direction (e.g., CCW) while propagating around the second coil 80 in the first direction. A further advantage of the embodiment shown in FIG. 7, is that the addition of the second coil 80 nulls the effect of any rotation experienced by the sensor while preserving the sensitivity to electric current. As a result, the accuracy of the current sensor is even further improved.

Other embodiments may utilize different configurations of optical components. For example, the focusing and collimation of the light into the resonator may be performed by lenses formed or placed between each beam splitter and the recirculator, and the recirculator may be substantially planar (i.e., not concave). The trenches may be replaced with waveguides formed within the substrate. Additionally, liquid media may also be used as a means of increasing the Verdet constant rather than gases. However, because of the higher index of refraction in liquids than in gases, the hollow core fiber may be designed to conduct light via index guiding rather than the band gap effect. Such may be accomplished, for example, by using fiber of similar micro-structure as that of hollow core fiber, allowing the central hole to be filled with the liquid, but masking the cell structure in the cladding so that they are air-filled or evacuated. In this way, the index of the surrounding cladding may be maintained below that of the liquid-filled core area, a requisite for lightwave guidance. It should also be noted that it may be advantageous to choose liquids with low linear birefringence and a low Kerr effect in order to minimize errors in the measurement of current.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An apparatus for sensing current comprising:
   an optical fiber having first and second opposing ends and a passageway therethrough;
   a recirculator configured such that when light propagates from the respective first and second ends of the optical fiber, at least some of the light is reflected by the recirculator into the respective opposing ends of the optical fiber to propagate through the optical fiber and form an optical loop having an opening therethrough; and
   a Faraday sensitive material positioned in the optical loop such that the light passes therethrough, an index of refraction of the Faraday sensitive material changing when a current flows through the opening of the optical loop.

2. The apparatus of claim 1, wherein the optical fiber defines a hollow passageway along its length and wherein at least some of the Faraday sensitive material is within the hollow passageway of the optical fiber.

3. The apparatus of claim 1, further comprising a first tunable light source configured to emit a first portion of light toward the recirculator and a second tunable light source configured to emit a second portion of light toward the recirculator, wherein the recirculator is configured such that the first and second portions of light are transmitted by the recirculator into respective first and second ends of the optical fiber and propagate in respective first and second directions around the optical loop.

4. The apparatus of claim 1, further comprising a hermetically-sealed chamber, the optical fiber and the recirculator being within the chamber, and wherein the Faraday sensitive material is at least one of a gaseous substance and a liquid substance.

5. The apparatus of claim 1, wherein the recirculator is shaped to focus the first and second portions of light into the first and second respective ends of the optical fiber.

6. The apparatus of claim 1, further comprising:
a first connecting structure for attaching the first end of the optical fiber at a first location proximate the recirculator; and
a second connecting structure for attaching the second end of the optical fiber at a second location proximate the recirculator,
wherein at least one of the first and second connecting structures is configured to allow the respective first or second optical fiber end to be removably attached such that a conductor can be inserted into the optical loop without inserting an end of the conductor through the optical loop.

7. The apparatus of claim 6, wherein at least one of the first and second connecting structures includes a v-groove.

8. A fiber optic current sensor comprising:
a substrate;
first and second tunable light sources on the substrate and operable to emit respective first and second beams of light;
a recirculator on the substrate and configured such that the first and second beams of light are transmitted therethrough;
an optical fiber having first and second opposing ends and a hollow passageway therethrough, at least one end of the optical fiber being connected to the substrate and the optical fiber being arranged such that, after being transmitted by the recirculator, the first beam of light enters the first end of the optical fiber and is emitted from the second end of the optical fiber onto the recirculator and the second beam of light enters the second end of the optical fiber and is emitted from the first end of the optical fiber onto the recirculator, a portion of the first beam being reflected by the recirculator into the first end of the optical fiber and a portion of the second beam being reflected by the recirculator into the second end of the optical fiber such that the optical fiber and the recirculator jointly form a resonant optical loop with an opening therethrough, the first beam propagating around the resonant optical loop in a clockwise direction and the second beam propagating around the resonant optical loop in a counterclockwise direction, and at least some of the first beam and at least some of the second beam being transmitted by the recirculator;
a Faraday sensitive material positioned in the hollow passageway, an index of refraction of the Faraday sensitive material changing from a first value to a second value in the clockwise direction of light propagation and from a third value to a fourth value in the counterclockwise direction when a current flows through the opening of the optical loop;
first and second photo-detectors on the substrate arranged to capture the respective at least some of the first and second beams of light; and
a processor on the substrate and in operable communication with the first and second light sources and the first and second photo-detectors and configured to:
tune the first and second tunable light sources;
calculate a difference between resonance frequencies for the clockwise and counterclockwise directions around the optical loop; and
determine a current flowing through the opening in the optical loop based on the difference between the resonance frequencies.

9. The fiber optic current sensor of claim 8, further comprising a hermetically-sealed chamber connected to the substrate, the optical fiber and the recirculator being within the chamber, and wherein the Faraday sensitive material is at least one of a gaseous substance and a liquid substance.

10. The fiber optic current sensor of claim 9, further comprising a transmitter on the substrate and in operable communication with the processor.

11. The fiber optic current sensor of claim 10, wherein the optical fiber is arranged in a first coil and a second coil, the first coil corresponding to the optical loop such that the first beam of light propagates around the first coil in a clockwise direction, the second beam of light propagates around the first coil in a counterclockwise direction, the first beam of light propagates around the second coil in the counterclockwise direction, and the second beam of light propagates around the second coil in the clockwise direction.

12. The fiber optic current sensor of claim 11, wherein the second coil is configured to null an effect of movement experienced by the current sensor while preserving the sensitivity to electric current present in a conductor that runs through the first coil but not the second coil.

13. A method for sensing current comprising:
arranging a recirculator and an optical fiber having first and second opposing ends such that a first beam of light that is transmitted by the recirculator enters the first end of the optical fiber and is emitted from the second end of the optical fiber onto the recirculator and a second beam of light transmitted by the recirculator enters the second end of the optical fiber and is emitted from the first end of the optical fiber onto the recirculator, wherein a portion of the first beam is reflected by the recirculator into the first end of the optical fiber and a portion of the second beam is reflected by the recirculator into the second end of the optical fiber such that the optical fiber and the recirculator jointly form a resonant optical path loop with an opening therethrough, the first and second beams of light propagating around the resonant optical path loop in respective first and second directions;
positioning a Faraday sensitive material, having an index of refraction and a Verdet Constant, within the optical path loop such that the first and second beams of light pass therethrough;
conducting a current through the opening in the optical path loop, said current conduction causing the index of refraction of the Faraday sensitive material to change from a first value to a second value for light propagation in the first direction and from the first value to a third value for light propagation in the second direction;
determining first and second resonance frequencies for the respective first and second directions of propagation; and
calculating the current based on a difference between the first and second resonance frequencies.

14. The method of claim 13, wherein the flowing of the current through the opening in the optical path loop comprises positioning a conductor such that the conductor extends through the opening.

15. The method of claim 14, further comprising arranging the optical fiber into a coil and the positioning of the conductor comprises winding the conductor through the coil.

16. The method of claim 15, wherein the Faraday sensitive material is at least one of a gaseous or liquid substance and the positioning of the Faraday sensitive material comprises enclosing the optical fiber within a hermetically-sealed chamber and filling the chamber with the Faraday sensitive material.

17. The method of claim 14, wherein positioning the conductor comprises:
   removing at least one of the first and second ends of the optical fiber from the recirculator to create a gap in the optical loop;
   positioning the conductor in the optical loop through the gap without passing an end of the conductor into the optical loop; and
   reattaching the removed optical fiber end to the recirculator to close the gap in the optical loop.

18. The method of claim 14, wherein positioning the conductor comprises:
   inserting the conductor in a gap of the optical loop without passing an end of the conductor into the optical loop; and
   attaching at least one of the first and second opposing ends of the optical fiber to the recirculator to close the gap in the optical loop.

19. The method of claim 13, wherein arranging the recirculator and the optical fiber includes arranging a first optical loop and a second optical loop, wherein conducting a current includes conducting the current through an opening in the first optical loop, wherein the current is not conducted through the second optical loop, and wherein the method further comprises:
   nulling an effect of a movement of the first and second optical loops using the second loop.

* * * * *